United States Patent [19]

Edwards et al.

[11] Patent Number: 4,783,623
[45] Date of Patent: Nov. 8, 1988

[54] DEVICE FOR USE WITH A UTILITY METER FOR RECORDING TIME OF ENERGY USE

[75] Inventors: Cree A. Edwards, Belmont; Larsh M. Johnson, San Francisco, both of Calif.

[73] Assignee: Domestic Automation Company, Foster City, Calif.

[21] Appl. No.: 902,199

[22] Filed: Aug. 29, 1986

[51] Int. Cl.$^4$ .............................................. G01R 1/20
[52] U.S. Cl. ................... 324/156; 324/157; 324/113; 340/870.02; 361/364
[58] Field of Search ............... 324/156, 137, 157, 116, 324/113; 340/870.02, 870.03; 250/231 SE; 361/366, 367, 368, 372, 364

[56] References Cited

U.S. PATENT DOCUMENTS

| | | | |
|---|---|---|---|
| 3,683,343 | 8/1972 | Feldman et al. | 340/870.02 |
| 3,820,073 | 6/1974 | Vercellotti et al. | 340/870.03 |
| 4,050,020 | 9/1977 | Germer et al. | 324/116 |
| 4,119,948 | 10/1978 | Ward et al. | 340/151 |
| 4,120,031 | 10/1978 | Kincheloe et al. | 364/464 |
| 4,132,981 | 1/1979 | White | 250/239 |
| 4,166,975 | 9/1979 | Germer et al. | 324/116 |
| 4,179,654 | 12/1979 | Germer | 324/116 |
| 4,298,839 | 11/1981 | Johnston | 324/157 |
| 4,315,248 | 2/1982 | Ward | 340/825.72 |
| 4,415,853 | 11/1983 | Fisher | 324/74 |
| 4,463,354 | 7/1984 | Sears | 340/870.02 |
| 4,465,970 | 8/1984 | DiMassimo et al. | 324/116 |
| 4,516,213 | 5/1985 | Gidden | 364/483 |
| 4,556,844 | 12/1985 | Wason | 324/156 |
| 4,584,527 | 4/1986 | Amigo | 324/157 |
| 4,638,314 | 1/1987 | Keller | 340/870.02 |

*Primary Examiner*—Reinhard J. Eisenzopf
*Assistant Examiner*—Robert W. Mueller
*Attorney, Agent, or Firm*—Flehr, Hohbach, Test, Albritton, & Herbert

[57] ABSTRACT

A device for recording time of energy use for use with standard electric meters having a rotatable disc. The device includes a housing securable within a meter below the disc. A series of mounting holes are formed in the housing for mounting the device within the meter. The holes are arranged such that the device may be mounted within any standard electric meter.

26 Claims, 4 Drawing Sheets

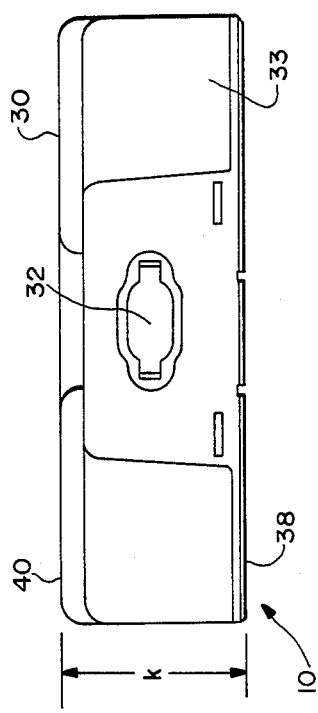
FIG.—4
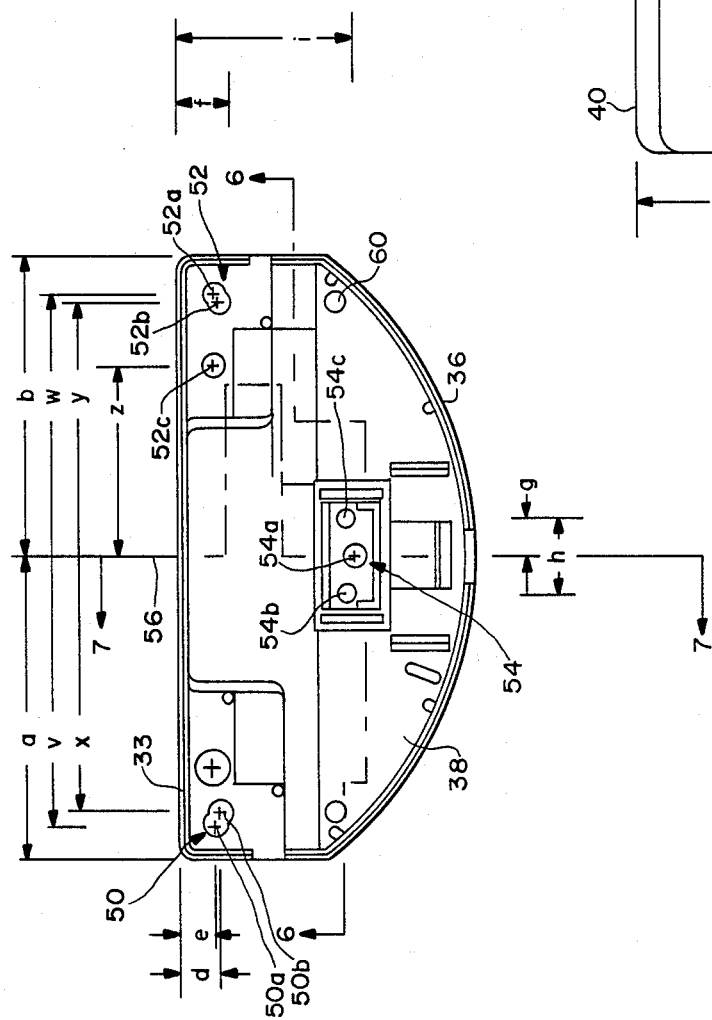
FIG.—3

DEVICE FOR USE WITH A UTILITY METER FOR RECORDING TIME OF ENERGY USE

The present invention relates generally to utility meters for recording energy consumption, and more particularly to a device readily installed within standard electric meters for recording time of energy use.

Electrical energy is generally sold and metered on the basis of a fixed rate schedule, for example a fixed rate per kilowatt-hour delivered. Electrical energy demand, however, varies considerably during the course of the day. Nonetheless, the fixed rate applies whether the demand for energy is high or low.

Since there are peak and slow periods occurring at different times of the day, electrical distribution and generation systems are overloaded at certain times and underutilized at other times. This results in substantial inefficiencies as a much larger generation and distribution system than is economically desirable is required to meet the peak demands. Additionally, the low demand consumer is in effect subsidizing the high demand consumer as they are both charged the same rate for power consumption.

Various attempts have been made in the past to spread the demand for energy over greater portions of the day. For instance, clock mechanisms have been utilized for decreasing the flow of electricity during peak load periods. These systems, however, have been found to be impractical due to the necessity of frequent checking and setting of the clock switching mechanism at the various consumer locations, and due to the inability to predict peak demand load intervals and to then change the clock mechanism's timing on a relatively simple basis to track such intervals.

Multiple rate structures have also been utilized in an effort to spread the demand for energy. Consumers using electrical energy during low demand periods are charged a lower rate than consumers using energy during high demand periods. The multiple rate structure thus provides an economic incentive for consumers to use electrical energy during low demand periods, thereby leveling the load requirements placed on the generation system.

Multiple rate structures have been satisfactorily utilized for large commercial and industrial consumers. However, they have more or less proved impractical for residential consumers due to the high cost of replacing existing electric meters with new electric meters capable of metering power consumption by time of use.

Examples of metering systems capable of registering different amounts of power consumed during different intervals of the day include a two-stage mechanical watt meter having a clock timer. Cams on the clock timer trip a mechanism which, at selected times, permit the driving of one set of meter dials or the other so that power consumption, during a selected portion of the day, could be registered by the first set of dials, while power consumed during the other portion of the day could be registered by the second set of dials. See U.S. Pat. No. 2,139,821.

Another system utilized dual rate meters wherein a clock determined which set of meters were to be activated. See U.S. Pat. Nos. 2,132,256 and 2,246,185.

Still another type of meter included three sets of decade gear driven dials for registering kilowatt hours consumed on a continuous basis, kilowatt hours consumed during mid-peak periods, and kilowatt hours consumed during high-peak periods. A programmable control circuit controlled the operation of the dials by activating the desired set at a predetermined time. The time period selection was based on time internally generated in 15 minute increments on a weekly cycle. See U.S. Pat. No. 4,050,200.

Time-of-day demand meters measure and record power consumption on a demand meter register during demand intervals of predetermined lengths. The demand register is capable of being engaged at the start of a demand interval, as determined by a program in the meter, and disengaged to terminate the demand interval as determined by an interval counter. The demand intervals occur at fixed times throughout the day. See U.S. Pat. No. 4,179,654.

A variation of this type of meter provides for metering electrical energy consumption at multiple rates depending on the time of day, time of week and time of year. See U.S. Pat. No. 4,465,970.

Excellent, highly-standardized, electromechanical meters for metering power consumption at fixed rates are currently in place at literally millions of locations throughout the United States. These meters are readily available and relatively inexpensive. Thus, the most practical and inexpensive way to provide for a multiple rate structure is to provide a device for recording time of energy use that is readily utilized with such standard electric meters.

Examples of such standard meters include: the D5S meter type manufactured by the Westinghouse Corporation, Raleigh, N.H.; the I-70-S meter type manufactured by the General Electric Corporation, Somersworth, N.H.; the MS meter type manufactured by Landis & Gyr (Duncan), Lafayette, Ind.; and the J4 meter type manufactured by Sangamo, Atlanta, Ga. The above-identified General Electric, Landis & Gyr and Sangamo meters have been manufactured since at least 1970.

Accordingly, a general object of the present invention is to provide a relatively inexpensive device readily installed on standard meters for recording time of energy use.

Another object of the present invention is to provide a device for recording time of energy use wherein the device is configured to fit within the confines of an enclosure of a standard meter.

Yet another object of the present invention is to provide a device for recording time of energy use, demand and load profile data wherein the device may be readily mounted to and within standard meters.

The present invention is directed to a device for use with standard meters having a rotatable disc for recording energy use. The meters have a rotatable disc and a transparent cup-shaped cover securable to a base to provide an enclosure. The device is capable of recording time of energy use from which energy bills can be calculated based upon time of use energy rates. The device comprises a housing configured to fit within the meter enclosure beneath the disc. A series of mounting holes are formed within the housing for mounting the device to the structure within the meter. The holes are arranged so that the device may be mounted in any standard watthour meter.

The device of the present invention will be described in more detail hereinafter in conjunction with the drawings wherein:

FIG. 3 is a schematic front view of the device of the present invention without the faceplate;

FIG. 4 is a schematic top view of the device of the present invention;

Figure 1:
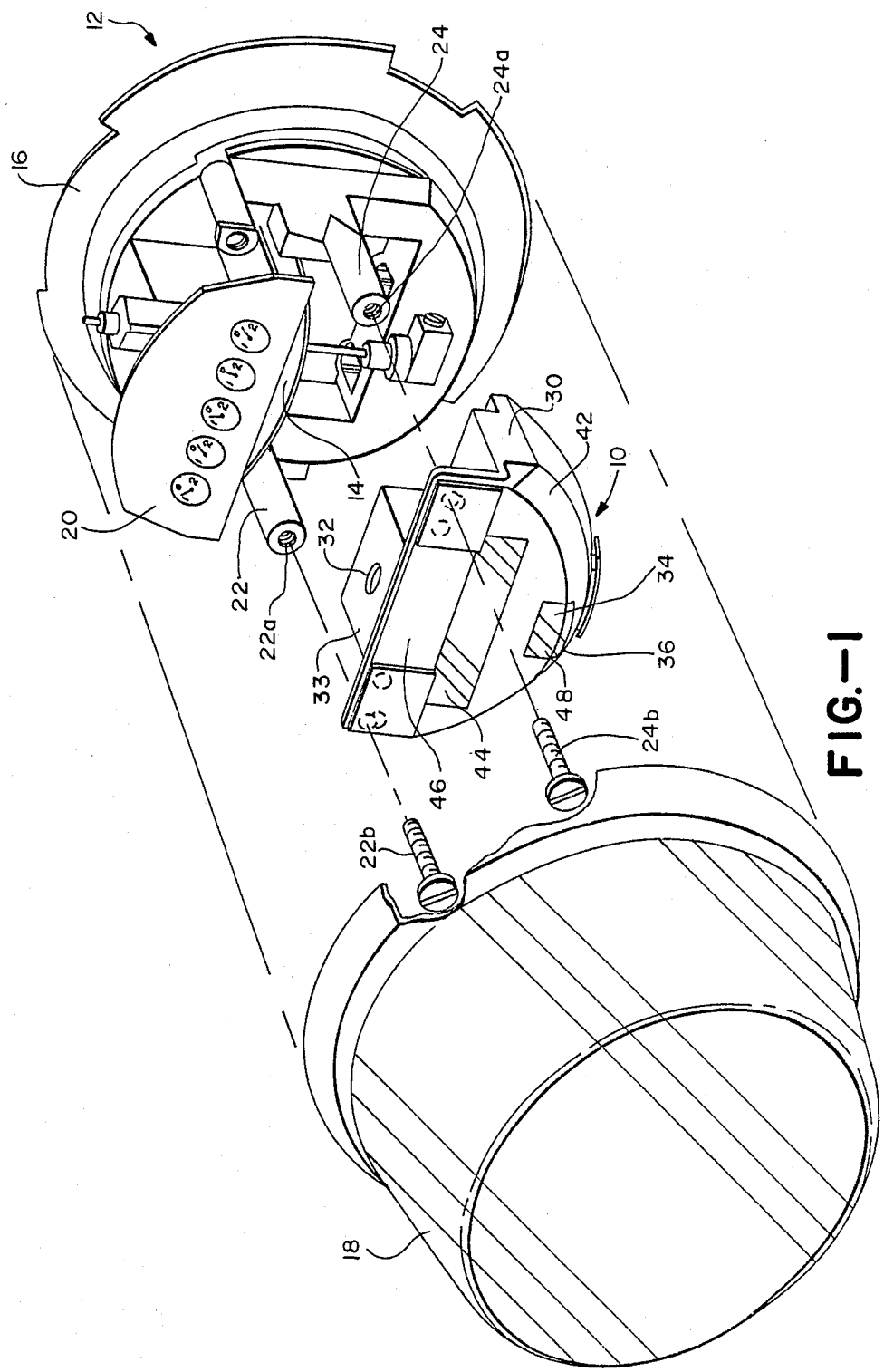
FIG. 1 is a perspective view illustrating the device of the present invention (with a faceplate) being mounted to one type of standard electric meter.
Figure 2:
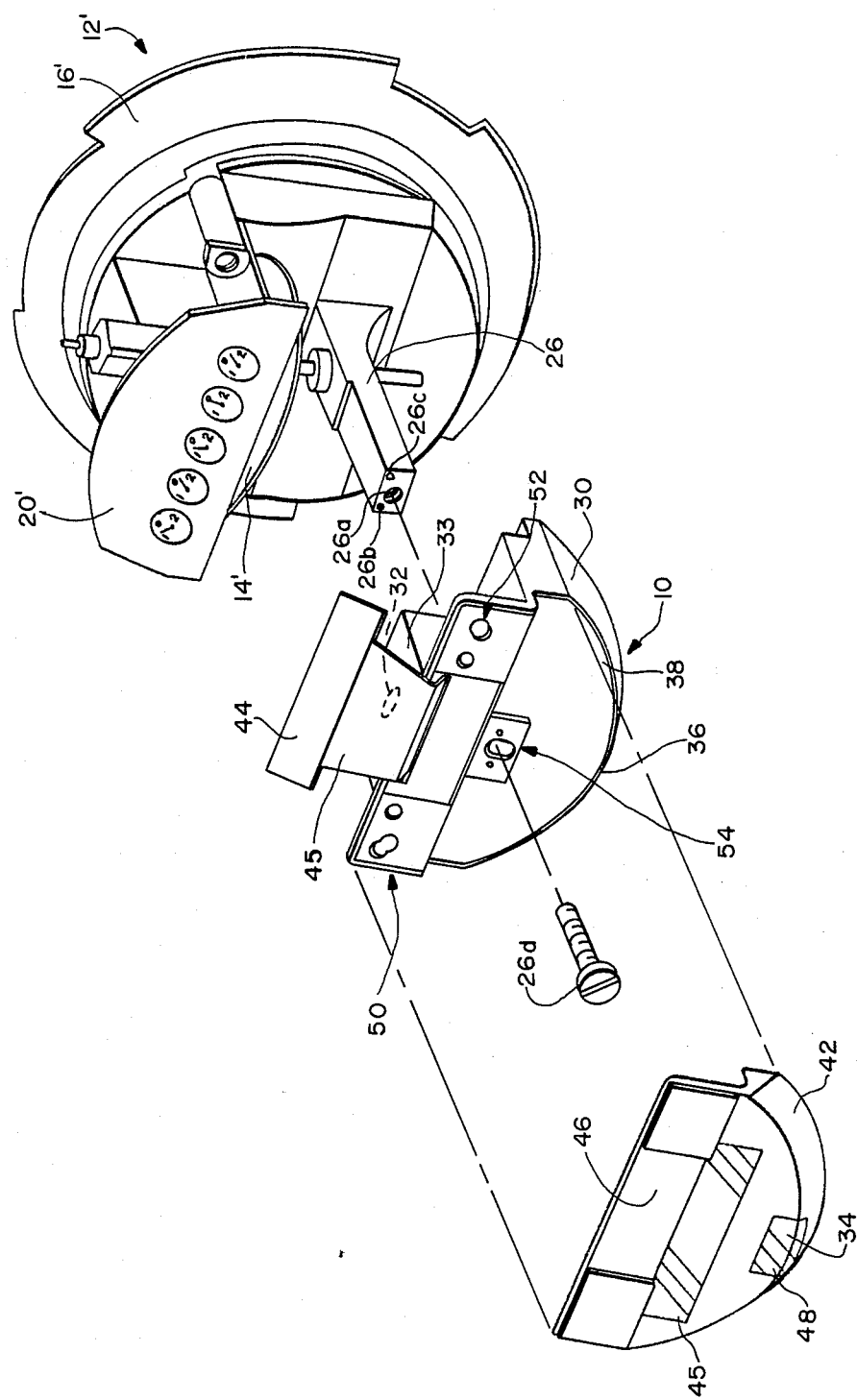
FIG. 2 is a perspective view illustrating the device of the present invention (without a faceplate) being mounted to a second type of standard electric meter.
Figure 5:
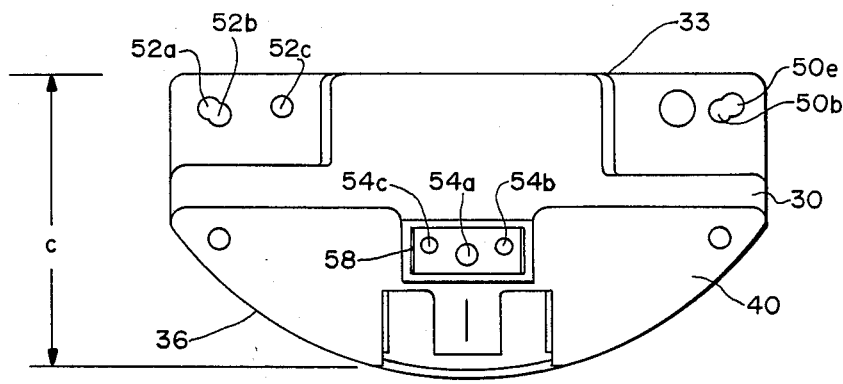
FIG. 5 is a schematic rear view of the device of the present invention.
Figure 6:
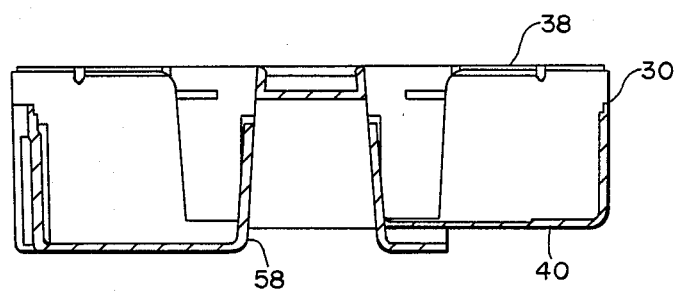
FIG. 6 is a sectional view along line 6—6 of FIG. 3.
Figure 7:
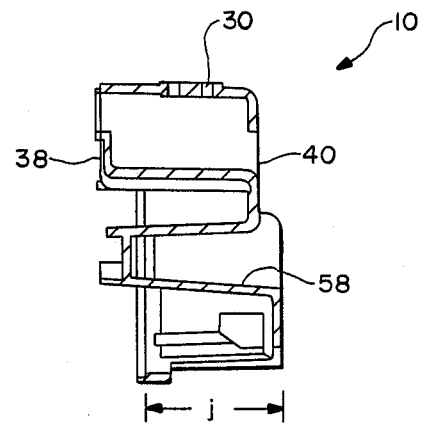
FIG. 7 is a sectional view along line 7—7 of FIG. 3.

Referring now to the drawings, reference is first made to FIGS. 1 and 2. These figures illustrate the device of the present invention, indicated generally by reference numeral 10, being mounted to two different types of utility meters 12, 12'. The meters are single stator watthour meters that include an Eddy current disc or meter wheel 14, 14'. The disc revolves at a rate proportional to current throughput such that each disc revolution or half revolution represents a specific quantity of metered energy consumption.

Meters 12, 12' further include a base 16, 16' and a transparent cup-shaped cover 18 (the cover for meter 12' is not shown) securable to the base. The cover provides an enclosure for the meter. It is normally made of a transparent glass or impact-resistant plastic material that protects the meter from environmental conditions and that prevents unauthorized access. The mechanical dial register 20, 20' of each meter is visible through the meter cover. The dial register indicates the total number of kilowatt hours consumed, and thus provides a measure of electrical energy consumption. The watthour metering movement that is part of the meter is not shown in any detail as the construction of the movement is well known to those skilled in the art.

The device of the present invention is configured to be mounted within the following Class 200 watthour meters as well as other meters having a similar internal structure: the D5S meter type manufactured by the Westinghouse Corporation, Raleigh, N.H.; the I-70-S meter type manufactured by the General Electric Corporation, Somersworth, N.H.; the MS meter type manufactured by Landis & Gyr (Duncan), Lafayette, Ind.; and the J4 meter type manufactured by Sangamo, Atlanta, Ga. Meters of the type just identified, including meters having a similar internal structure, will be hereinafter referred to as standard watthour meters or standard electric meters. The meters are identified as such as they have been manufactured and used by utilities for many years, and they are usually installed at new consumer locations or are used to replace older meters.

A Landis & Gyr MS type watthour meter is illustrated in FIG. 1. A Sangamo J5S type watthour meter is illustrated in FIG. 2. As discussed, the operation and general construction of these meters are substantially the same. However, their internal structure differs in one important aspect with respect to the device of the present invention.

The meter 12 includes two mounting posts 22 and 24 disposed more or less on opposite sides of the meter structure. The mounting posts include respective threaded openings 22a and 24a designed to receive a threaded member such as screws 22b and 24b. An identification plate is normally mounted on the mounting posts within the meter enclosure. The identification plate, as is well known in the art, carries information such as the meter's model number and serial number.

The meter 12' includes a single mounting post 26 substantially located in the center of the meter structure. The identification plate is normally mounted to central mounting post 26. Mounting post 26 includes a threaded opening 26a in the top thereof as well as two locating pins 26b and 26c. The locating pins engage respective openings in the identification plate. The threaded opening is configured to receive a threaded member such as a screw 26d for securing the identification plate to the meter structure.

Two of the other types of standard electric meters, the Westinghouse and General Electric meters, mount the identification plate in a manner similar to that of meter 12. However, the spacing between the mounting posts for each of these meters differs from meter 12 as well as from each other.

The device 10 of the present invention is capable of recording time of energy use, peak demand for energy, and energy load profile data. It is usable with and mountable to standard watthour meters.

The device measures time of energy use by detecting the rate of rotation of the meter's disc. A black mark (not illustrated) is located on the lower surface of the disc. Sensor means are mounted within a housing 30 of device 10 to detect the black mark as it rotates past an optical port 32 in the top surface 33 of housing 30. The sensor means may comprise an infrared light-emitting diode and a phototransistor that generate a signal in response to the passage of the disc past optical port 32.

The rotating black mark interrupts reflection of infrared light to the sensor means, once each revolution. The phototransistor generates a different signal in response to that interruption. The signals are processed and stored by appropriate circuitry in device 10.

The energy consumption information gathered by device 10 may thereafter be collected by use of a portable, electronic, meter reader. The meter reader may be programmed to calculate a utility usage charge using different billing rates for different times of the day, week, or year. The information recorded by device 10 is transmitted to the meter reader through optical data port 34 located in faceplate 42 of device 10. The meter reader may communicate with device 10 by means of an infrared serial transmitter and receiver. An infrared light source and reception means may be located within housing 30 for communicating with the meter reader. Infrared light is transmitted through the meter's glass cover with sufficient intensity to be received on the opposite side. The glass cover thus does not have to be replaced.

The device 10 may further include a liquid crystal display ("LCD") 44 to provide meter information to the consumer and the utility by a direct view of the device through the meter's cover. The meter may thus also be read manually.

The LCD 44 is connected by a flexible, electrical cable 45 to the circuitry of device 10. The use of the flexible cable permits LCD 44 to be flipped out of the way when mounting device 10 to meter 12'.

The elements and circuitry for generating information, such as time of energy use, and thereafter transferring that information to a system for calculating billing rates, for example an electronic meter reader, are described in greater detail in our co-pending patent application entitled "A System For Use With A Utility Meter For Recording Time of Energy Use", and assigned to the assignee of this application, and which co-pending application is hereby incorporated by reference.

The housing 30 is configured to fit within the structure of standard watthour meters below the discs thereof. The lower portion or surface 36 of housing 30 has a substantially arcuate-shaped configuration that conforms to the shape of the meter cover. When installed within the meter, the optical port 32 and thus the sensor means of device 10 are in effect automatically aligned with the lower surface of the meter disc.

The housing 30 includes a front face 38 and a rear face 40 (see FIGS. 3–7). The faceplate 42 is secured to front face 38. The faceplate is placed in position after the housing has been mounted within the meter (See FIGS. 1 and 2). The faceplate includes an opening for viewing of the LCD 44. The faceplate also includes an information bearing surface 46. The surface 46 includes the pertinent information that would have been displayed by the meter identification plate, which, of course, has been replaced by device 10. The faceplate further includes an optical filter 48 for filtering out non-infrared light that would otherwise enter optical port 34.

The housing 30 may be mounted within any standard watthour meter. To allow for such mounting, a first set of mounting openings, indicated by reference numeral 50 (see also FIGS. 3 and 5), is formed in housing 30 at one side thereof near top surface 33 of the housing. A second set of mounting openings, indicated generally by reference numeral 52, is formed on the opposite side of the housing near its top surface. And a third set of mounting openings, indicated generally by reference numeral 54, is formed in housing 30 more or less along a center line 56 thereof near bottom surface 36 of the housing. Thus, the third set of mounting openings 54 is located between and beneath the first and second set of mounting openings 50 and 52, respectively.

The mounting openings extend through housing 30 so that appropriate securing means, such as screws 22b, 24b, and 26d may be utilized to secure the housing within the meter. As noted, after the housing has been secured within the meter, faceplate 42 covers the front face of the housing.

The three sets of mounting openings are located in the housing so that they may be aligned with the threaded openings formed in the different mounting posts of the various standard watthour meters. The first set of mounting openings 50 comprises holes 50a and 50b. The second set of mounting openings 52 comprises holes 52a, 52b and 52c. The holes 50a and 50b, and the holes 52a and 52b each comprise an offset hole.

As shown in FIG. 3, openings 50a and 52a are located 1.765 (distance v) and 1.750 (distance w) inches, respectively, from center line 56 of housing 30. Openings 50b and 52b are symmetrically arranged about the center line, each located 1.687 (distances x and y) inches therefrom. Opening 52c is located 1.275 (distance z) inches from the center line. The distances between the mounting openings permits device 10 to be mounted to different types of meters having different spacing between mounting posts.

As shown in FIG. 1, the Landis & Gyr, Westinghouse and General Electric meters each include two mounting posts, one on each side of the meter. The mounting openings 50a and 52a are provided to align with the threaded openings formed in the mounting posts of the General Electric meter. Similarly, the mounting openings 50b and 52b are provided to align with the threaded openings formed in the mounting posts of the Landis & Gyr meter. And the mounting openings 50a and 52c are provided to align with the threaded openings formed in the mounting posts of the Westinghouse meter.

The third set of mounting openings 54 are utilized for mounting housing 30 to a meter having a central mounting post like that illustrated in FIG. 2. The J4 type meter manufactured by Sangamo is an example of such a meter.

The third set of mounting openings comprises three individual holes 54a, 54b and 54c. Hole 54a is positioned along the center line 56. Openings 54b and 54c are symmetrically disposed on opposite sides of that line. Opening 54a is alignable with the threaded opening formed in the central mounting post of the meter. Openings 54b and 54c are adapted to engage locating pins formed on the central mounting post. A rear channel or recess 58 is formed in the rear surface of the housing (see FIGS. 5–7) for receiving the central mounting post. Thus, the central mounting post extends into channel 58 where, as noted, the locating pins and threaded opening of the central post are aligned with the respective mounting openings 54a, 54b and 54c. A threaded member such as screw 26d extends through opening 54a and into a threaded opening in the central mounting post to secure the housing within the meter.

The device 10 fits within and may be mounted to standard watthour meters, without modifying such meters. The installation is simplified by the shape and volume of the device, and by its clean, modular, fully enclosed configuration. Installing and retrofitting the device to watthour meters is further simplified due to the "automatic" alignment of the disc sensing and communications optical ports 32 and 34, respectively. The device is readily installed without damage. Two power leads of the device, extending from opening 60 (FIG. 3), attach easily to the meters' existing terminal posts.

The housing 30 may be constructed of a plastic material, such as polycarbonate, wherein individual components of the housing may be ultrasonically bonded together to form a rigid one piece structure. As discussed, the faceplate is removably secured to the housing, and the LCD is flexibly connected to circuitry within housing 30.

In a preferred embodiment, the device 10 may have the following approximate dimensions, in inches, referring to FIGS. 3, 4, 5, and 7: a and b=2.000; c=1.914; d=0.245; e=0.205; f=0.350; g=0.250; h=500; i=1.170; j=1.29; and k=1.200.

Although certain embodiments of the invention have been described herein in detail, the invention is not to be limited only to such embodiments, but rather only by the appended claims.

What is claimed is:

1. A device for use with an electric meter having a rotatable disc for recording energy use, comprising:
   a housing configured to fit within the meter below the disc, said housing containing circuit means for recording energy use;
   a series of mouting holes formed in said housing for mounting said housing within the meter, said holes arranged such that said housing may be mounted in any standard electric meter.

2. The device of claim 1 wherein the front side of said housing includes a display.

3. The device of claim 2 wherein the front side of said housing further includes an optical data port.

4. The device of claim 3 further including an optical data port in the top surface of said housing through which a sensor means may detect rotation of the disc.

5. A device for recording time of energy use for use with electric meters having a rotatable disc, comprising:
   a housing configured to fit within a meter beneath the disc, said housing containing circuit means for recording time of energy use;
   a first set of openings formed in said housing at a first side thereof;
   a second set of openings formed in said housing at a second side thereof; and
   selected openings of said first and second sets of openings alignable with openings existing in the structure of the meter for securing said housing therein wherein the locations of the openings in the meter structure are different for different meters.

6. The device of claim 5 further including a third opening formed in said housing near the bottom surface thereof between said first and second sets of openings and substantially along the the center line of said housing, said third opening alignable with an opening existing in the structure of a meter for securing said housing therein.

7. The device of claim 6 wherein said third opening is a set of openings including three holes with two of said holes adapted to engage locating pins on a central mounting post of the meter, and a third hole alignable with a threaded opening in said central mounting post.

8. The device of claims 5 or 7 wherein said first set of openings includes three holes, selected ones of which are alignable with a threaded opening formed in a first mounting post on one side of a meter.

9. The device of claim 8 wherein said second set of openings includes two holes, selected ones of which are alignable with a threaded opening formed in a second mounting post on the opposite side of the meter.

10. A device for recording time of energy use for use with electric meters having a rotatable disc, comprising:
    a housing configured to fit within a meter beneath the disc and securable therein, said housing containing circuit means for recording time of energy use;
    a first set of two openings formed in said housing at a first side and near the top surface thereof;
    a second set of three openings formed in said housing at a second side and near the top surface thereof; and
    selected openings of said first and second sets of openings alignable with threaded openings existing in mounting posts located at opposite sides of the meter for securing said housing thereto.

11. The device of claim 10 further including a third set of three openings formed in said housing between said first and second sets and substantially along a center line of said housing, one of said openings of said third set alignable with a threaded opening existing in a central mounting post of a meter for securing said housing therein and two of said openings of said third set adapted to engage locating pins on said central post.

12. The device of claim 10 wherein a first opening of said first set is located about 1.765 inches from a center line of said housing and a first opening of said second set is located about 1.750 inches from said center line.

13. The device of claim 12 wherein a second opening of said first set and a second opening of said second set are each located about 1.687 inches from said center line.

14. The device of claim 13 wherein a third opening of said second set is located about 1.275 inches from said center line.

15. A device for recording time of energy use for use with electric meters haivng a rotatable disc and a cup-shaped cover securable to a base to provide an enclosure, comprising:
    a housing having front and rear faces, and configured to fit within the enclosure below the disc, said housing containing circuit means for recording time of energy use;
    a first set of mounting openings formed at one side of said housing near the top thereof;
    a second set of mounting openings formed at the opposite side of said housing near the top thereof;
    selected ones of said first and second sets of mounting openings alignable with openings formed in a meter structure to secure said housing within the enclosure; and
    a third set of mounting openings formed in said housing near the bottom thereof and between said first and second sets of mounting openings, at least one opening of said third set alignable with an opening formed in a meter structure for securing said housing within the enclosure.

16. The device of claim 15 wherein said third set of mounting openings is located within a recess formed in the rear face of said housing for receiving a central mounting post of a meter.

17. The device of claims 15 or 16 wherein a first opening of said first set is located about 1.765 inches from a center line of said housing and a first opening of said second set is located about 1.750 inches from said center line.

18. The device of claim 17 wherein a second opening of said first set and a second opening of said second set are each located aboout 1.687 inches from said center line.

19. The device of claim 18 wherein a third opening of said second set is located about 1.275 inches from said center line.

20. A device for recording time of energy use for use with standard electric meters having a rotatable disc and a cup-shaped cover securable to a base to provide an enclosure, comprising:
    a housing having front and rear faces, and configured to fit within the enclosure below the disc, said housing containing circuit means for recording time of energy use;
    a first set of two mounting openings formed at one side of said housing near the top thereof;
    a second set of three mounting openings formed at the opposite side of said housing near the top thereof;
    selected openings of said first and second sets of mounting openings adapted to align with openings formed in mounting posts at opposite sides of a meter for securing said housing within the enclosure wherein the distance between mounting posts of different types of meters varies; and
    a third set of mounting openings formed within a recess in the rear face of said housing located between said first and second sets of mounting openings near the bottom of said housing, said recess configured to receive a central mounting post of a meter for securing said housing thereto by means of said third set of mounting openings.

21. The device of claim 20 wherein a first opening of said first set is located about 1.765 inches from a center line of said housing and a first opening of said second set is located about 1.750 inches from said center line.

22. The device of claim 21 wherein a second opening of said first set and a second opening of said second set are each located about 1.687 inches from said center line.

23. The device of claim 22 wherein a third opening of said second set is located about 1.275 inches from said center line.

24. The device of claim 23 wherein said third set includes an opening lying along said center line for aligning with an opening formed in said central mounting post.

25. The device of claim 20 further including a liquid crystal display flexibly connected to said housing.

26. A device for recording time of energy use for use with electric meters having a rotatable disc, comprising:

a housing configured to fit within the meter beneath the disc;

sensor means located within said housing for detecting rotation of the disc and generating a signal in response thereto;

an optical sensor port in the top surface of said housing through which said sensor means may detect rotation of the disc;

circuit means within the said housing for processing and storing said signal for calculating time of energy use information;

communication circuit means within said housing for optically transmitting said time of energy use information to a location external of the meter;

a first set of openings formed in said housing at a first side thereof;

a second set of openings formed in said housing at a second side thereof; and selected openings of said first and second sets of openings alignable with openings existing in the structure of the meter for securing said housing therein.

* * * * *